US010928448B2

(12) United States Patent
Stellari et al.

(10) Patent No.: US 10,928,448 B2
(45) Date of Patent: *Feb. 23, 2021

(54) AUTOMATED SCAN CHAIN DIAGNOSTICS USING EMISSION

(71) Applicant: INTERNATIONAL BUSINESS MACHINES CORPORATION, Armonk, NY (US)

(72) Inventors: Franco Stellari, Waldwick, NJ (US); Peilin Song, Lagrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/686,699

(22) Filed: Nov. 18, 2019

(65) Prior Publication Data

US 2020/0088791 A1 Mar. 19, 2020

Related U.S. Application Data

(63) Continuation of application No. 16/297,011, filed on Mar. 8, 2019, now Pat. No. 10,591,539, which is a continuation of application No. 14/945,892, filed on Nov. 19, 2015, now Pat. No. 10,302,697.

(51) Int. Cl.
*G01R 31/317* (2006.01)
*G06F 30/398* (2020.01)
*G01R 31/311* (2006.01)

(52) U.S. Cl.
CPC ...... *G01R 31/31728* (2013.01); *G01R 31/311* (2013.01); *G06F 30/398* (2020.01)

(58) Field of Classification Search
CPC ........ G01R 31/31728; G01R 31/31835; G01R 31/311; G06F 30/398
See application file for complete search history.

(56) References Cited

U.S. PATENT DOCUMENTS 8,356,218 B2 1/2013 Funatsu
8,645,896 B1 2/2014 Suri et al.
8,689,070 B2 4/2014 Huang et al.
(Continued)

FOREIGN PATENT DOCUMENTS

EP 1 939 641 7/2008

OTHER PUBLICATIONS

Franco Stellari et al., Verification of Untrusted Chips using Trusted Layout and Emission Measurements, 2014 IEEE International Symposium on Hardware-Oriented Security and Trust (HOST), May 6 to May 7, 2014.

(Continued)

*Primary Examiner* — Stacy Whitmore
(74) *Attorney, Agent, or Firm* — Tutunjian & Bitetto, P.C.; Daniel Morris

(57) ABSTRACT

A method for automated scan chain diagnostics includes comparing actual emission signatures for individual design elements to expected emission signatures, the individual design elements having pixels allocated thereto associated with an image of a device registered to a design layout, and determining whether the actual emission signatures differ from the expected emission signatures by more than a threshold amount to determine if a defect is present.

20 Claims, 5 Drawing Sheets

(56) References Cited

U.S. PATENT DOCUMENTS

| | | |
|---|---|---|
| 8,750,595 B2 | 6/2014 | Stellari |
| 10,302,697 B2 * | 5/2019 | Stellari ............ G01R 31/31728 |
| 10,591,539 B2 * | 3/2020 | Stellari ............ G01R 31/31728 |
| 2010/0192112 A1 | 7/2010 | Nakazato |
| 2015/0006987 A1 | 1/2015 | Narayanan et al. |

OTHER PUBLICATIONS

Peilin Song et al. A Novel Scan Chain Diagnostics Technique Based on Light Emission from Leakage Current, Test Conference, 2004. Proceedings, ITC 2004. International, Oct. 26 to Oct. 28, 2004, pp. 140-147.

List of IBM Patents or Patent Applications Treated as Related dated Nov. 18, 2019, 2 pages.

* cited by examiner

AUTOMATED SCAN CHAIN DIAGNOSTICS USING EMISSION

BACKGROUND

The present invention relates to analysis and diagnostics of a device under test and, more particularly, to automated analysis of an image to locate particular components that show aberrant behavior.

Device diagnostics, and in particular scan chain diagnostics, are used to improve the yield of a manufacturing process. Scan chains may use up to 30% of a chip's available area and, therefore, provide a statistically large sample of the chip's coverage when looking for systematic and random defects.

While tester- and software-based scan chain diagnostics have been quite successful, they nonetheless suffer from low resolution and cannot identify some kinds of failure. As to the former, in most cases a scan failure may be narrowed down to only a small group of components, rather than to a single point of failure. As to the latter, tester-based methodologies cannot identify logic equivalent gates. In many cases, several other gates are inserted along a scan chain, between, e.g., consecutive latches or flip-flops. Such gates may form, e.g., buffer repeaters or multiplexers. Therefore, even in ideal conditions, the maximum resolution achievable is limited to the latch granularity, where a first latch works and the subsequent latch does not, but cannot yield any information about where the defect is located in the patch between those two latches. In reality, the distance between two latches could be thousands of microns long, with a large number of other gates in between.

While emission-based diagnostics dramatically increases the diagnostic resolution, bringing it down to individual gates and transistors, these techniques suffer from significantly longer diagnostic times. Even if adequate setup planning has been performed in preparation of a new product, a bottleneck remains in the actual execution of data collection, which involves navigation, focusing, and emission collection.

Furthermore, due to the complexity of modern circuit layouts and the limited quality of collected emission images, it can be challenging for a human operator to interpret the information gleaned through emission diagnostics. Small differences may go undetected by the human operator and may be open to personal interpretation.

SUMMARY

A method for automated scan chain diagnostics includes comparing actual emission signatures for individual design elements to expected emission signatures. The individual design elements have pixels allocated thereto associated with an image of a device registered to a design layout. The method further includes determining whether the actual emission signatures differ from the expected emission signatures by more than a threshold amount to determine if a defect is present.

A method for automated diagnostics includes registering an image of a device under test (DUT) to a corresponding design layout. The image is segmented based on the registration to allocate pixels to individual design elements with a processor. Emission signatures for the individual design elements are compared to expected signatures. It is determined whether the emissions differ from the expected signatures more than a threshold amount to determine if a defect is present.

A method for automated diagnostics includes registering an image of a DUT to a corresponding design layout. The image is segmented based on the registration to allocate pixels to individual design elements with a processor by converting layout polygons to equivalent pixels at a same scale as the image. Emission signatures for the individual design elements are compared to expected signatures. It is determined whether the emission signatures differ from the expected signatures by more than a threshold amount to determine if a defect is present. A next test location on the DUT is selected by a binary search in accordance with a logic path on the design layout and the determination of whether a defect is present.

A method for automated scan chain diagnostics includes segmenting an image of a device associated with a design layout to allocate pixels to individual design elements, comparing actual emission signatures for the individual design elements to expected emission signatures, and determining whether the actual emission signatures differ from the expected emission signatures by more than a threshold amount to determine if a defect is present.

A system for automated scan chain diagnostics includes at least one processor device configured to compare actual emission signatures for individual design elements to expected emission signatures. The individual design elements have pixels allocated thereto associated with an image of a device registered to a design layout. The at least one processor device is further configured to determine whether the actual emission signatures differ from the expected emission signatures by more than a threshold amount to determine if a defect is present A system for automated scan chain diagnostics includes at least one processor device configured to segment an image of a device associated with a design layout to allocate pixels to individual design elements, compare actual emission signatures for the individual design elements to expected emission signatures, and determine whether the actual emission signatures differ from the expected emission signatures by more than a threshold amount to determine if a defect is present.

These and other features and advantages will become apparent from the following detailed description of illustrative embodiments thereof, which is to be read in connection with the accompanying drawings.

BRIEF DESCRIPTION OF THE DRAWINGS

The disclosure will provide details in the following description of preferred embodiments with reference to the following figures wherein.

DETAILED DESCRIPTION

Embodiments of the present invention provide automatic chip diagnostics using, e.g., emission-based tools to provide gate-level diagnostic resolution with reduced turnaround time. A design layout is automatically matched to an image to provide device localization and registration and emissions analysis is performed to identify areas of aberrant or unexpected behavior.

Figure 1:
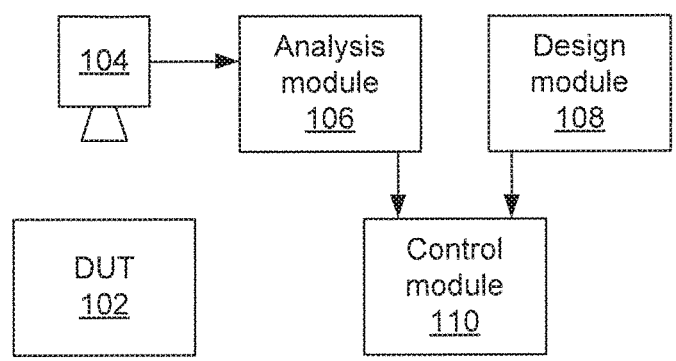
FIG. 1 is a block diagram of an emissions-based test system in accordance with the present principles.

Referring now to the drawings in which like numerals represent the same or similar elements and initially to FIG. 1, a system 100 for device diagnostics is shown. A camera 104 images a device under test (DUT) 102 and produces data that is analyzed by the analysis module 106. Although the use of camera 104 is specifically described herein, it should be understood that any appropriate data acquisition and analysis technology may be employed. Examples of such tools include picosecond imaging circuit analysis (PICA), static emission tools, laser voltage probes, laser stimulation tools, focus ion beams, etc. The analysis module accepts raw data from the camera 104 or other probe device and turns the raw data into an image of the DUT 102. The image is provided to a control module 110. The analysis module 106 may further identify key points in the image to be used as markers. This information may include coordinates, magnification, field of view, etc.

A design module 108 accesses a design layout that corresponds to the DUT 102 and supplies the design layout to the control module 110. The control module 110 adapts the design layout in accordance with key points in the image, scaling and orienting the design layout to overlay the design layout and the image and create a composite image. The control module 110 may change the size and position of the design layout to fit the image. The fit of the design layout to the composite image is performed automatically according to one or more optimization schemes. The outputs are compared according to some metric (e.g., a figure of merit (FOM)) to determine which produces the best match.

The control module 110 thereby converts the design layout to a set of pixels, assigning each pixel to particular devices in the layout. Using these correspondences, the control module 110 determines a received light intensity for each pixel and translates this information into a received light intensity for each device. This information is used to determine whether the intensity of light matches an expected value. Those components which exhibit unexpected behavior (either with an intensity that is higher or lower than expected) are flagged for review.

One challenge in matching the image to the design layout is that the two representations of the device are built on different kinds of data. The image is formed from individual pixels, while the layout is a set of ideal polygons. Units, scale, rotation, and translation are generally different for each location. A manual three-point alignment process can lead to very slow and sub-optimal results compared to the automatic registration of the present embodiments.

Figure 2:
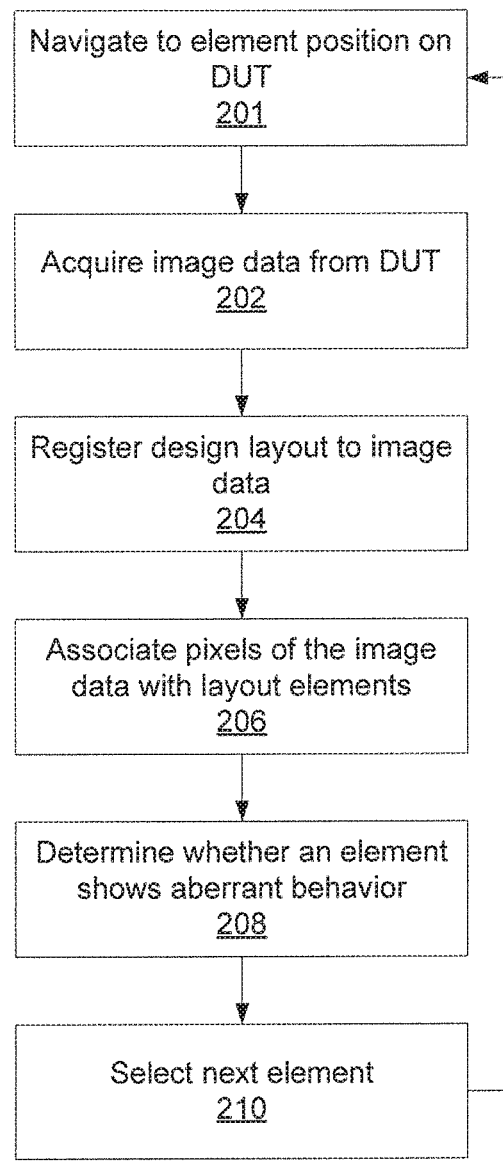
FIG. 2 is a block/flow diagram of a method for automated emissions image analysis in accordance with the present principles.

Referring now to FIG. 2, a method for automated diagnostics is shown. Block 201 navigates the device stage to a specific element position on the DUT. A list of coordinates for devices that are to be tested, along with a suite of test conditions/patterns are provided to the control module 110. For a given initial location, the control module 110 aligns the field of view of the layout module 108 and the analysis module 106, moving the DUT's stage until a given component in the design layout is in view.

Block 202 acquires image data from the DUT 102 using, e.g., camera 104. Block 204 registers the design layout provided by design module 108 to the image data provided by the analysis module 106. Registration maps the layout coordinates into the image coordinates using, e.g., a three-point alignment guided by a user.

Block 206 associates individual pixels of the image data with particular layout elements. These pixels have intensities associated with emissions from the DUT 102. Thus the image data is collected according to each test condition being evaluated. Registration is performed according to one or more optimization techniques. One example of registration is based on manual inputs, where a user selects three or more points in the image and in the design layout that correspond to one another, thereby creating an explicit transformation between the two. However, manual registration in this fashion is often inaccurate. Automatic registration may be performed instead, which can greatly increase the speed and accuracy of the registration. Exemplary registration processes include Scale (S) optimization (bounded) (where scale and translations are optimized using a bounded least square optimization), S optimization (seed) (where scale and translations are optimized using a least square optimization and a starting point/seed estimated from the nominal lens magnification used by the acquisition tool), S optimization (exhaustive) (where the FOM is calculated for a selected set of different scale and translation parameters and the optimal parameters are later chosen in accordance with the maximum of the FOM), and S optimization with rotation (R) fit (exhaustive) (where the FOM is calculated for a selected set of different scale, rotation, and translation parameters and the optimal parameters are chosen in correspondence with the maximum of the FOM). A comparison between these optimizations is provided in Table 1. Each is computed to produce a figure of merit (FOM) and their relative speeds are shown. The parameters (scale, rotation, x-translation, and y-translation) are optimized to maximize the FOM.

TABLE 1

| Method | Scale S | Rotation R | dx | dy | FOM | Speed |
| --- | --- | --- | --- | --- | --- | --- |
| Manual | 2.39 μm/p | 0.6° | 587.5 μm | −45.2 μm | 24,704 | Slow |
| S (bound) | 2.393 μm/p | 0 | 586 μm | −47.1 μm | 28,648 | Fast |
| S (seed) | 2.393 μm/p | 0 | 586 μm | −47.1 μm | 28,643 | Fast |
| S (exh) | 2.392 μm/p | 0 | 585.8 μm | −47.1 μm | 28,586 | Slow |
| S, R (exh) | 2.392 μm/p | 0.46° | 585.7 μm | −46.3 μm | 29,722 | Slow |

As shown, exhaustive and manual searches are slow, with manual performing the worst and an exhaustive search that includes scaling and rotation having the best FOM. The FOM may be calculated according to any appropriate metric including, e.g., correlation between the two images. Different optimizations may perform better in different contexts and chip layouts, so block 206 can either weigh the different options and select the one having the best FOM or may, alternatively, use a predetermined optimization.

Block 206 identifies "bright" and "repetitive" layout structures with "stable" expected emission signatures based on previous test data. For example, in one exemplary implementation, local clock buffers may be used to generate signatures, as they are bright and nominally identical in both static and switching modes. Local clock buffers have a "disk" type signature, corresponding to the bright spot that would be visible in the emission images. Block 206 then creates or extracts an expected image signature based on the expected emissions. The layout and signature information create a predictive signature mask representing the locations of expected emissions. Once the signature mask is formed, the FOM may be calculated as a two-dimensional cross-correlation between the measured emission image and the signature mask.

Block 208 then identifies the layout elements showing aberrant behavior by comparing them to either predictive emission signatures or a library of known good signatures that have been collected from a working device. Block 208 makes an evaluation as to whether the probed location corresponds to a pass or fail condition. Operations may be repeated for another probe location that is selected based on previous results, for example following a binary search approach, where a measurement that shows no activity indicates a failure earlier in the chain. In this fashion, a specific failure point in a scan chain can be determined. Block 210 thereby selects a next element and processing returns to block 201 to navigate to the newly selected element. Image data segmentation in this manner provides for more reliable decision making and faster diagnostic turnaround time.

In certain cases, multiple gates of interest may be acquired in a single field of view. For example multiple latches (flip-flops) of a scan chain or buffers in between may all be captured by a single image. Since emission acquisition is usually the most time-consuming step of the process, all of these gates of interest may be identified in the same emission images and analyzed together or in sequence before the decision to move the tool stage to a different location is made. In this sense, information about the pass/fail conditions of multiple locations along the scan chain may be acquired in an order that does not follow a precise search pattern. However, the pass/fail information may be used to decide which gate to measure next.

Furthermore, it may actually be desirable to perform an initial optimization of the number of measurement locations in view of scan chain information so that the maximum number of scan chain gates can be covered using a minimum number of acquisitions and stage movements.

In another embodiment the pattern emission image (including reflected light, laser scanning image, etc.) is automatically registered to the layout. In this case it can be assumed that the emission image (or laser stimulation, or laser voltage image) is already aligned to the pattern image by the analytical tool used to acquire both images. For example, in the case of emission and reflected light pattern images, the same lenses and cameras are used to acquire both images from the chip in a short amount of time so that mechanical and thermal drift is minimized. Acquiring the image data in block 202 may optionally include, for example, using sharpening filters and the creation of a specific mask layer from the roughly aligned layout. In one example, this alignment is achieved via 3 point alignment. The layer mask is created by selecting one or more specific layout layers, combining the selected layers, processing the resulting image to remove features, change contrast and colors, etc. Two-dimensional cross correlation (or feature recognition) may then be used to pair features in the processed pattern image to features in the processed layout mask in block 206. From this process, scaling, rotation, and translation parameters are computed. The resulting parameters, obtained from the pattern image analysis, are then used to adjust and register the original (or processed) emission image to the original layout shapes. From the resulting emission to layout/cad overlay, the emission data can be segmented and analyzed as described above.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 3:
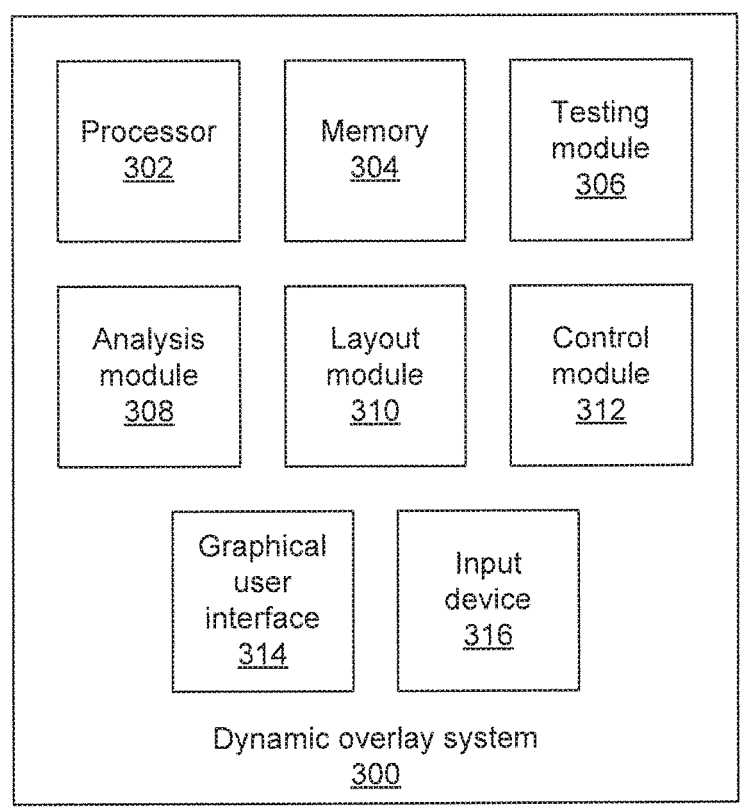
FIG. 3 is a block diagram of a system for automated emissions image analysis in accordance with the present principles.

Referring now to FIG. 3, a system 300 for automated diagnostics is shown. The system 300 includes a hardware processor 302 and memory 304. The system 300 further includes multiple functional modules. These modules may be implemented as, e.g., software that is executed on the processor 302 and stored in the memory 304. Alternatively, the modules may be implemented as one or more discrete hardware units in the form of, e.g., application specific integrated chips or field programmable gate arrays. Additionally, the system 300 may be one device or multiple device in communication with one another. In the latter case, some form of communication interface will be present to exchange information between different physical devices.

A testing module 306 communicates with, e.g., camera 104 to obtain real-time data from DUT 102. The analysis module 308 receives this data and, as described above, obtains information about the data. Similarly layout module 310 accesses the design layout stored in memory 304 and obtains information that is correlated with the data from the analysis module 308 by the overlay module 312.

In one specific embodiment, the analysis module 308 and the layout module 310 are standalone pieces of software, each having a respective window in the graphical user interface 314. The analysis module 308 is often associated directly with the particular form of data collection and may be supplied by the manufacturer. As such, it may be difficult to alter the behavior of the analysis module 308 directly. Similarly, while multiple types of layout software exist, it cannot be assumed that the hard-coded behavior of the layout module 310 can be modified.

A control module 312 collects data from the analysis module 308 and the layout module 310 to perform registration of the design layout and the image data. The control module 310 further associates the pixels of image data with layout elements and creates a set of expected signatures for the design layout. The control module 312 uses these signatures and the emission image data to refine the alignment of the design layout and the image, optimizing a figure of merit to determine a best transformation. The control module 312 determines whether given points show aberrant behavior (i.e., emissions that do not match the expected signatures) and guides the positioning of the DUT 102 using the testing module 306, either directly or through analysis module 308.

The control module 312 interacts with the graphical user interface 314 to display the results of its diagnostics and to identify layout elements that may be malfunctioning. A user may use an input device 316 to navigate the image of the DUT 102 and to provide feedback as to whether a given flagged point represents a malfunction or not. The user can furthermore use the input device 316 to control the progress of the diagnostics, for example controlling a binary search of a given scan chain.

Figure 4:
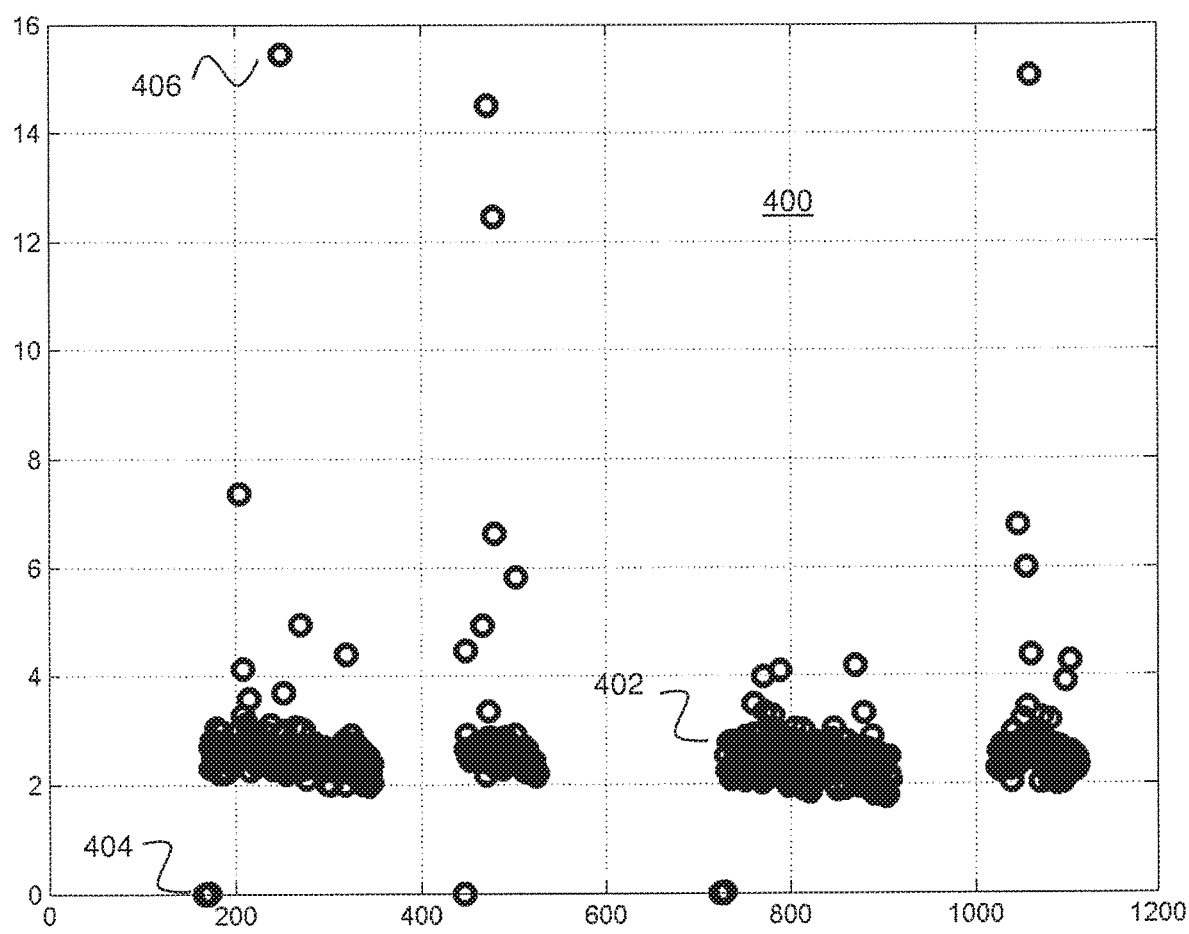
FIG. 4 is a diagram showing emissions data in accordance with the present principles.

Referring now to FIG. 4, a graph 400 shows emissions of a set of latches in a given image. On the X axis, each latch is sequentially numbered. On the Y axis, the emission intensity from each latch is shown. While the majority of latches 402 have their emissions clustered around a Y value of 2.5, some latches 404 have emissions of zero and some latches 406 have emissions of 15-16.

Figure 5:
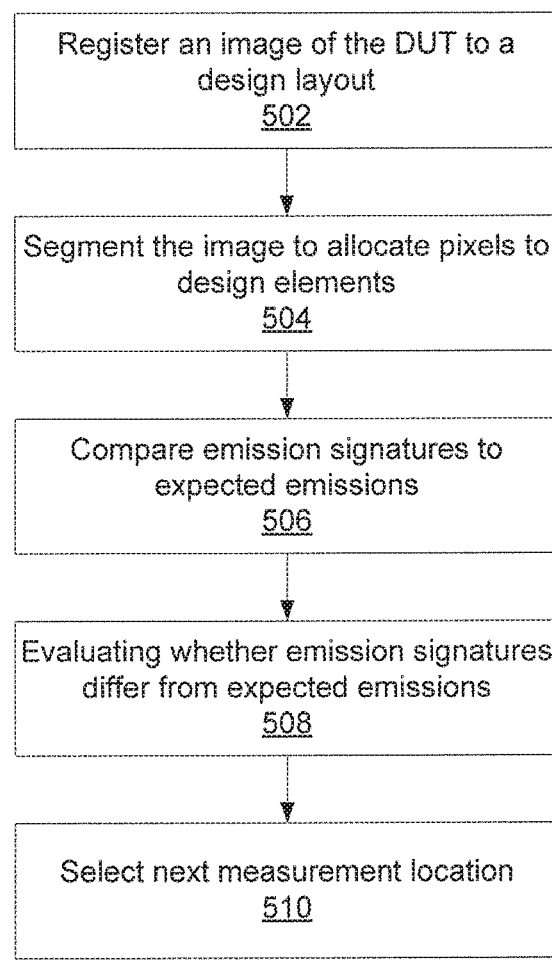
FIG. 5 is a block/flow diagram of a method for automated emissions image analysis in accordance with the present principles.

Referring now to FIG. 5, a method of performing automated diagnostics is shown. Block 502 registers an image of the DUT 102 to a design layout as described above, using for example a three-point alignment to identify common features between, e.g., a pattern image or set of emissions and a layout corresponding to the DUT 102. Block 504 segments the image, identifying particular pixels whose output corresponds to respective design elements in the layout. Block 506 then compares the emission signatures of the individual design elements to expected emission signatures. The expected emission signatures may be determined from theoretical expectations for the respective component or may instead be based on collected data from the entire image (or from images of other devices).

Block 508 evaluates whether emission signatures differ from the expected emissions. As shown in FIG. 4, this may be a very stark difference, but may instead be a smaller difference that would be difficult to perceive with the human eye. If the emission signature is deemed abnormal, for example if the difference between the measured emissions and the expected emissions exceeds a threshold, then the user may be alerted to that fact. In addition, the information may be used to select the next physical location on the DUT 102 to measure.

For example, if a scan chain (or other logic chain) is being measured, where it is known that a defect occurs somewhere in the scan chain, the first measurement may be at an area covering the middle of the scan chain. If the measurement detects an error for a second portion of the elements in the image, but not for the first portion, then the element that caused the error can be identified. If the measurement detects an error for all of the elements in the image, then block 510 selects the next position earlier in the chain. If the measurement detects no error in the image, then block 510 selects the next position later in the chain. In this manner, a binary search may be performed until the defect in the chain is located.

Having described preferred embodiments of automated scan chain diagnostics using emission (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for automated scan chain diagnostics, comprising:
   comparing actual emission signatures for individual design elements to expected emission signatures, the individual design elements having pixels allocated thereto associated with an image of a device registered to a design layout; and
   determining whether the actual emission signatures differ from the expected emission signatures by more than a threshold amount to determine if a defect is present.

2. The method of claim 1, further comprising selecting a next test location on the device in accordance with a logic path on the design layout, and navigating to the next test location to generate a next image of the device.

3. The method of claim 2, wherein selecting the next test location further includes selecting a location earlier in the logic path if an error is located and selecting a location later in the logic path if an error is not located, wherein the next location selected maximizes coverage of the logic path in a minimum number of acquisitions.

4. The method of claim 1, further comprising segmenting the image, including converting layout polygons to equivalent pixels at a same scale as the image.

5. The method of claim 4, further comprising generating a predictive signature mask that represents locations of expected emissions based on the design layout and the expected emission signatures, and determining how well the predictive signature mask matches measured emissions in the image based on a figure of merit.

6. The method of claim 5, further comprising optimizing an alignment between the image and the design layout to maximize the figure of merit.

7. The method of claim 5, further comprising calculating the figure of merit as a two-dimensional cross-correlation between the image and the predictive signature mask.

8. The method of claim 5, wherein generating the predictive signature mask further includes identifying layout elements that are expected to have a high-intensity and repetitive emission signature to form the predictive signature mask as a map of such layout elements.

9. The method of claim 1, further comprising:
   acquiring the image using a camera;
   registering the image to the design layout; and
   segmenting the image based on the registration.

10. The method of claim 9, wherein registering the image further includes registering a pattern image of the device that includes non-emission information and a processed layout mask.

11. A computer program product comprising a non-transitory computer readable storage medium comprising a computer readable program for automated scan chain diagnostics, wherein the computer readable program when executed on a computer causes the computer to perform a method comprising:
   comparing actual emission signatures for individual design elements to expected emission signatures, the individual design elements having pixels allocated thereto associated with an image of a device registered to a design layout; and
   determining whether the actual emission signatures differ from the expected emission signatures by more than a threshold amount to determine if a defect is present.

12. A system for automated scan chain diagnostics, comprising:
at least one processor device configured to:
compare actual emission signatures for individual design elements to expected emission signatures, the individual design elements having pixels allocated thereto associated with an image of a device registered to a design layout; and
determine whether the actual emission signatures differ from the expected emission signatures by more than a threshold amount to determine if a defect is present.

13. The system of claim 12, wherein the at least one processor device is further configured to select a next test location on the device in accordance with a logic path on the design layout, and to navigate to the next test location to generate a next image of the device.

14. The system of claim 13, wherein the at least one processor device is further configured to select a location earlier in the logic path if an error is located and to select a location later in the logic path if an error is not located, wherein the next location selected maximizes coverage of the logic path in a minimum number of acquisitions.

15. The system of claim 12, wherein the at least one processor device is further configured to convert layout polygons to equivalent pixels at a same scale as the image.

16. The system of claim 15, wherein the at least one processor device is further configured to generate a predictive signature mask that represents locations of expected emissions based on the design layout and the expected emission signatures and to determine how well the predictive signature mask matches measured emission in the image based on a figure of merit.

17. The system of claim 16, wherein the at least one processor device is further configured to optimize an alignment between the image and the design layout to maximize the figure of merit.

18. The system of claim 16, wherein the at least one processor device is further configured to calculate the figure of merit as a two-dimensional cross-correlation between the image and the predictive signature mask.

19. The system of claim 16, wherein the at least one processor device is further configured to generate the predictive signature mask by identifying layout elements that are expected to have a high-intensity and repetitive emission signature to create and form the predictive signature mask as a map of such layout elements.

20. The system of claim 12, wherein the at least one processor device is further configured to:
acquire the image using a camera; and
register the image to the design layout by registering a pattern image of the device that includes non-emission information and a processed layout mask; and
segment the image based on the registration.

* * * * *